United States Patent
Lee et al.

(10) Patent No.: US 8,248,860 B2
(45) Date of Patent: Aug. 21, 2012

(54) MEMORY DEVICE USING A VARIABLE RESISTIVE ELEMENT

(75) Inventors: Kwang-Jin Lee, Hwaseong-si (KR); Chang-Soo Lee, Hwaseong-si (KR); Joon-Min Park, Seoul (KR); Hui-Kwon Seo, Hwaseong-si (KR); Qi Wang, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 308 days.

(21) Appl. No.: 12/659,840

(22) Filed: Mar. 23, 2010

(65) Prior Publication Data

US 2010/0246239 A1    Sep. 30, 2010

(30) Foreign Application Priority Data

Mar. 25, 2009  (KR) .................. 10-2009-0025479

(51) Int. Cl.
*G11C 16/04*    (2006.01)

(52) U.S. Cl. .......... 365/185.29; 365/185.12; 365/185.23

(58) Field of Classification Search ............. 365/185.11, 365/185.12, 185.23, 185.29, 230.03, 230.06
See application file for complete search history.

(56) References Cited

U.S. PATENT DOCUMENTS

| 7,193,897 | B2 | 3/2007 | Lee |
| 7,542,353 | B2 | 6/2009 | Park |
| 7,586,783 | B2 * | 9/2009 | Lee ............... 365/185.11 |
| 7,684,254 | B2 | 3/2010 | Jung et al. |
| 7,843,757 | B2 * | 11/2010 | Ko ............... 365/230.03 |
| 8,068,365 | B2 * | 11/2011 | Kim ............. 365/185.12 |
| 8,120,990 | B2 * | 2/2012 | Kim ............. 365/238.5 |
| 2005/0172068 | A1 | 8/2005 | Sukegawa |

FOREIGN PATENT DOCUMENTS

| JP | 2007-257748 A | 10/2007 |
| KR | 10-2005-0079210 A | 8/2005 |
| KR | 10-2006-0075361 A | 7/2006 |
| KR | 10-0739256 B1 | 7/2007 |

* cited by examiner

*Primary Examiner* — Gene Auduong
(74) *Attorney, Agent, or Firm* — Muir Patent Consulting, PLLC

(57) ABSTRACT

A memory device includes a memory cell array including a plurality of memory blocks, each memory block including a plurality of memory cells, a plurality of word lines coupled to rows of the plurality of memory cells, a plurality of bit lines coupled to columns of the plurality of memory cells, and a control unit controlling an erase operation so that erase data is simultaneously written in the plurality of memory cells corresponding to an erase unit. A first erase mode may include a first erase unit and a first erase data pattern. A second erase mode may include a second erase unit and a second erase data pattern. At least one of the first and second erase units and the first and second erase data patterns are different.

13 Claims, 15 Drawing Sheets 510     520

510     520     530

510     540

MEMORY DEVICE USING A VARIABLE RESISTIVE ELEMENT

BACKGROUND

1. Technical Field

The present inventive concept relates to a memory device using a variable resistive element, and more particularly to a memory device using a variable resistive element which operates in diverse erase operation modes during an erase operation.

2. Description of the Related Art

A memory device using a resistance material includes a phase change random access memory (PRAM), a resistive RAM (RRAM), a magnetic RAM (MRAM), and the like. A dynamic RAM (DRAM) or a flash memory device stores data using charges, whereas a nonvolatile memory device using the resistance material stores data using the phase change of a phase change material such as a chalcogenide alloy (in the case of a PRAM), a resistance change of a variable resistance material (in the case of an RRAM), a resistance change of a magnetic tunnel junction (MTJ) thin film according to a magnetization state of a ferromagnetic material (in the case of an MRAM), and the like.

More specifically, the phase change material is changed to a crystalline state or an amorphous state as it is cooled after being heated. The phase change material in a crystalline state has a low resistance and the phase change material in an amorphous state has a high resistance. Accordingly, the crystalline state may be defined as set data or "0" data, and the amorphous state may be defined as reset data or "1" data.

SUMMARY

Embodiments are therefore directed to a memory device using a variable resistive element, which substantially overcomes one or more of the problems due to the limitations and disadvantages of the related art.

It is therefore a feature of an embodiment to provide a memory device using a variable resistive element that performs an erase operation in diverse erase operation modes.

It is another feature of an embodiment to provide a memory device using a variable resistive element that is used more efficiently.

At least one of the above and other features and advantages may be realized by providing a memory device which includes a memory cell array including a plurality of memory blocks, each memory block including a plurality of memory cells, a plurality of word lines coupled to rows of the plurality of memory cells, a plurality of bit lines coupled to columns of the plurality of memory cells, and a control unit configured to control an erase operation so that erase data is simultaneously written in the plurality of memory cells corresponding to an erase unit. The erase unit may include a first erase unit and a second erase unit, different from the first erase unit. The control unit simultaneously writes the erase data in the plurality of memory dells corresponding to the first erase unit in a first erase mode and simultaneously writes the erase data in the plurality of memory cells corresponding to the second erase unit in a second erase mode.

According to another aspect of the present invention, there is provided a memory device, which includes a memory cell array including a plurality of memory blocks, each memory block including a plurality of memory cells, a plurality of word lines coupled to rows of the plurality of memory cells, a plurality of bit lines coupled to columns of the plurality of memory cells, and a control unit configured to control an erase operation so that erase data is simultaneously written in the plurality of memory cells corresponding to an erase unit. Erase data written in the plurality of memory cells included in the respective memory blocks may have different erase data patterns in first and second erase modes.

According to still another aspect of the present invention, there is provided a memory device, which includes a memory cell array including a plurality of memory blocks each memory block including a plurality of memory cells, and a control unit configured to control an erase operation so that erase data is simultaneously written in the plurality of memory cells corresponding to an erase unit. When the erase data is written in the plurality of memory cells corresponding to n (where, n is a natural number) erase units during an erase operation, the control unit is configured to control the erase operation using only a start address and a finish address among a plurality of addresses corresponding to the respective erase units.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
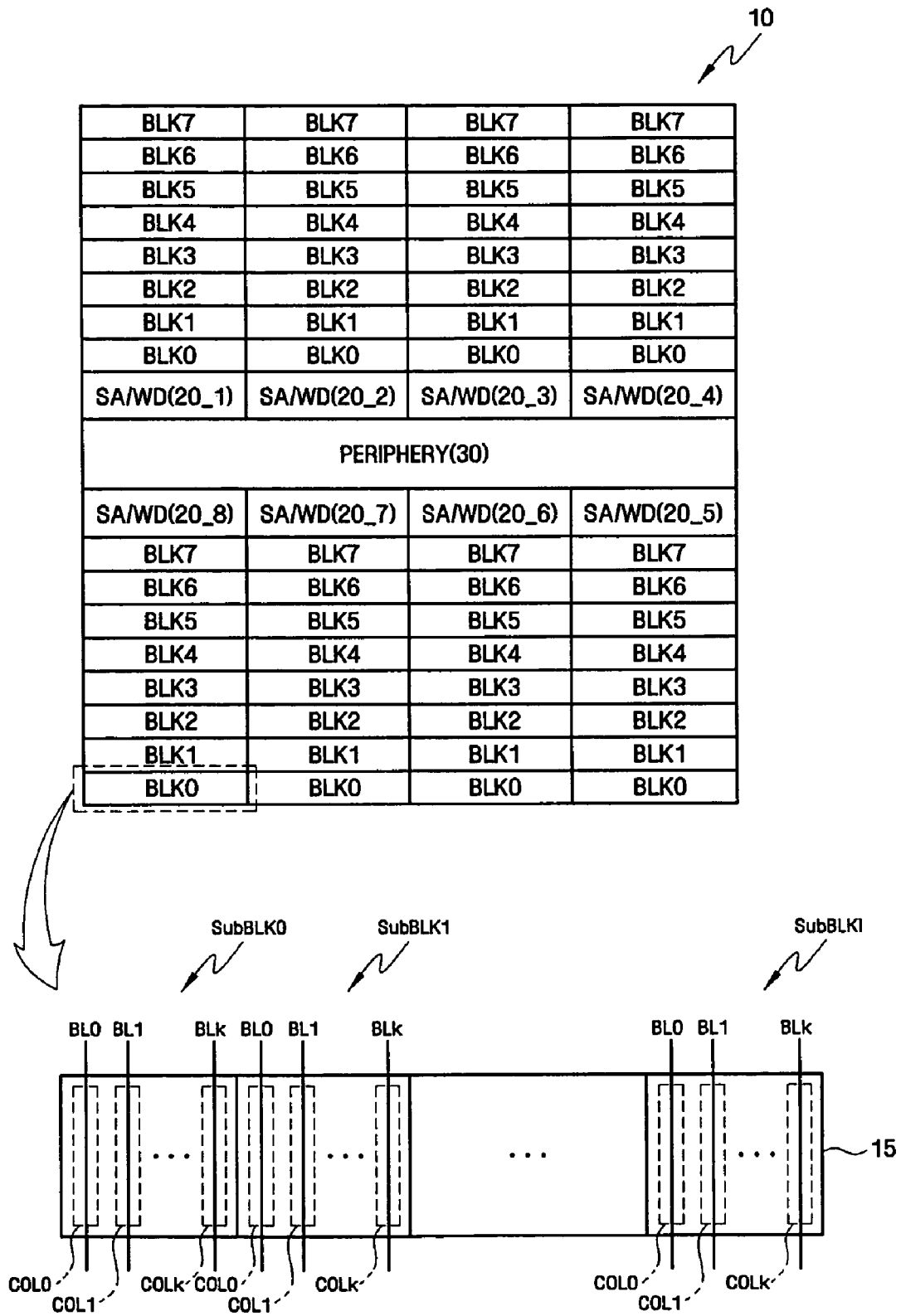
FIGS. 1 and 2 illustrate an exemplary block diagram and a circuit diagram explaining a memory device according to embodiments of the present inventive concept.

Korean Patent Application No. 10-2009-0025479, filed on Mar. 25, 2009, in the Korean Intellectual Property Office, and entitled: "Memory Device Using Variable Resistive Element," is incorporated by reference herein in its entirety.

Hereinafter, preferred embodiments of the present inventive concept will be described in detail with reference to the accompanying drawings. The aspects and features of the present inventive concept and methods for achieving the aspects and features will be apparent by referring to the embodiments to be described in detail with reference to the accompanying drawings. However, the present inventive concept is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the inventive concept, and the present inventive concept is only defined within the scope of the appended claims. In the entire description of the present inventive concept, the same drawing reference numerals are used for the same elements across various figures.

The term "connected to" or "coupled to" that is used to designate a connection or coupling of one element to another element includes both a case that an element is "directly connected or coupled to" another element and a case that an element is connected or coupled to another element via still another element. In this case, the term "directly connected to" or "directly coupled to" means that an element is connected or coupled to another element without intervention of any other element. In the entire description of the present inventive concept, the same drawing reference numerals are used for the same elements across various figures. Also, the term "and/or" includes the respective described items and combinations thereof.

Although the terms "first, second, and so forth" are used to describe diverse elements, components and/or sections, such elements, components and/or sections are not limited by the terms. The terms are used only to discriminate an element, component, or section from other elements, components, or sections. Accordingly, in the following description, a first element, first component, or first section may be a second element, second component, or second section.

In the following description of the inventive concept, the terms used are for explaining embodiments of the present inventive concept, but do not limit the scope of the present inventive concept. In the description, a singular expression may include a plural expression unless specially described. The term "comprises" and/or "comprising" used in the description means that one or more other components, steps, operation and/or existence or addition of elements are not excluded in addition to the described components, steps, operation and/or elements.

Hereinafter, embodiments of the present inventive concept will be described in detail with reference to the accompanying drawing.

Specifically, embodiments of the present inventive concept will be described using a phase change memory device, i.e. a phase change RAM (PRAM). However, it will be apparent to those of ordinary skill in the art to which the present inventive concept pertains that the present inventive concept can be applied to all nonvolatile memories using resistance materials, such as a resistive RAM (RRAM), a ferroelectric RAM (FRAM), and the like.

Figure 2:
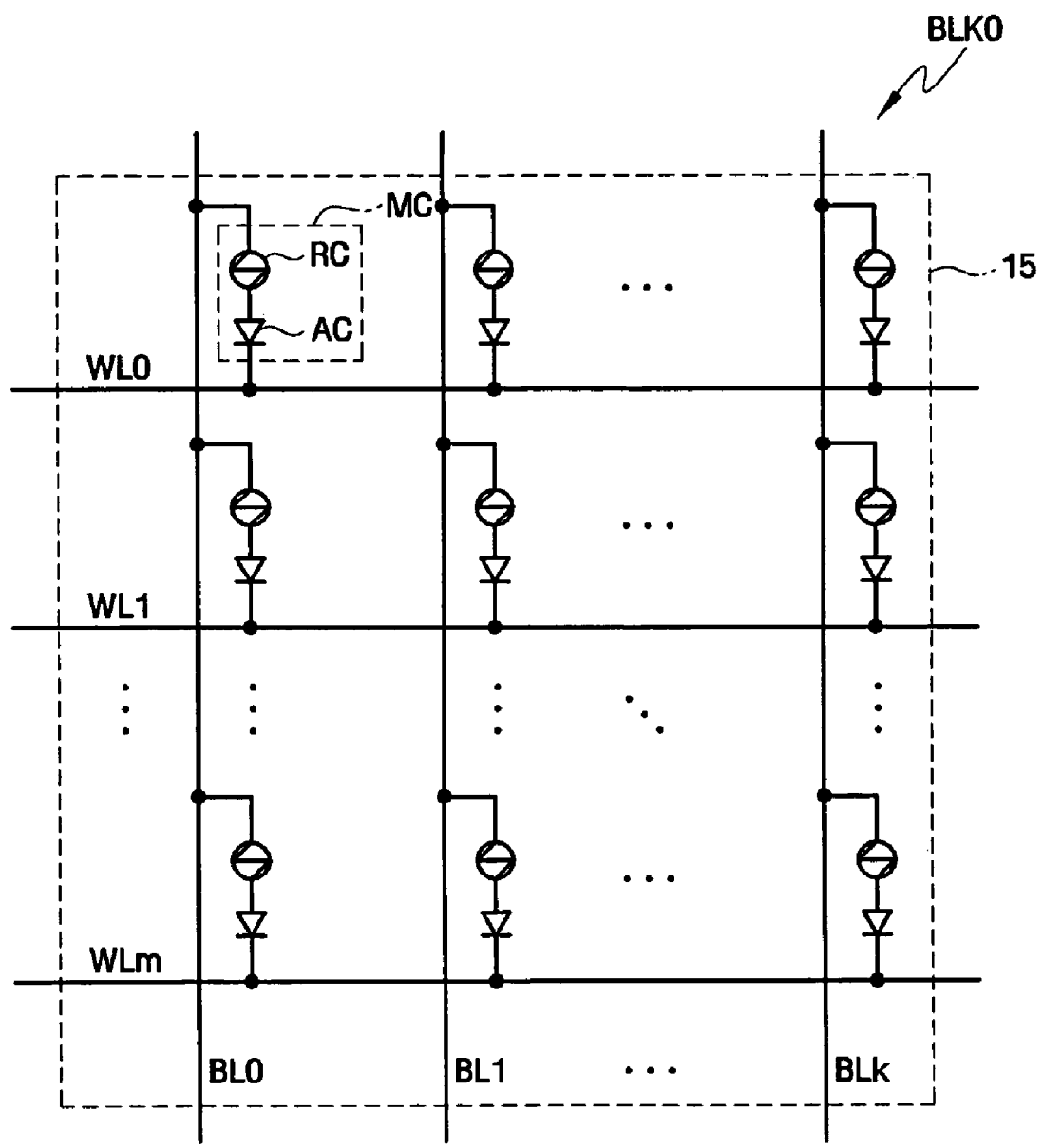

FIGS. 1 and 2 illustrate an exemplary block diagram and a circuit diagram explaining a memory device according to embodiments of the present inventive concept. In FIG. 1, for convenience in explanation, eight memory blocks are arranged for each sense amplifier and write driver, but the number of memory blocks is not limited thereto. In FIG. 2, for convenience in explanation, the circuit of a memory device is illustrated around only regions related to a first memory block BLK0.

Referring to FIG. 1, the memory device according to embodiments of the present inventive concept may include a memory cell array 10, a plurality of sense amplifiers and write drivers (or read/write circuits) 20_1 to 20_8, a peripheral circuit region 30, and the like.

The memory cell array 10 may include a plurality of memory blocks BLK0 to BLK7, and each memory block may include a plurality of memory sub-blocks SubBLK0 to SubBLK1. Here, the plurality of memory sub-blocks SubBLK0 to SubBLK1 include a plurality of memory columns COL0 to COLk that correspond to the same column addresses BL0 to BLk, and the respective memory columns COL0 to COLk that correspond to the same column addresses BL0 to BLk are arranged in the respective memory sub-blocks SubBLK0 to SubBLK1. Accordingly, the corresponding memory columns (e.g. COL0) in the plurality of memory sub-blocks SubBLK0 to SubBLK1 may be simultaneously accessed through one column address (e.g. BL0). Using this simultaneous access, a plurality of bits, e.g., one word, may be simultaneously input to or output from the plurality of memory columns COL0 to COLk. One word may be composed of, e.g., 2 to 4 bytes, and one byte may be composed of, e.g., four bits.

The sense amplifiers and write drivers 20_1 to 20_8 perform read and write operations in the memory cell designated by the row address and the column address. Although not illustrated in detail in the drawing, a row decoder and a column decoder for designating a row address and a column address of a memory cell to be read or written in the memory cell array 10 may be provided. Also, in the peripheral circuit region 30, a plurality of logic circuit blocks and voltage generation units for operating the row decoder, the column decoder, the sense amplifiers, and the write drivers may be provided.

Referring to FIG. 2, each memory block BLK0 to BLK7 may include a plurality of memory cells MC. The plurality of memory cells MC may be coupled between word lines WL0 to WLm and bit lines BL0 to BLk, respectively. Each memory cell MC may include a variable resistive element RC and an access element AC controlling current that flows through the variable resistive element RC. The variable resistive element RC may include a phase change material that has at least two resistance levels in accordance with data stored in the memory cell MC. The access element AC may be a diode, a transistor, or the like, which is coupled in series to the variable resistive element RC. In the drawing, it is exemplified that the access element AC is a diode. However, the access element is not limited thereto. Also, the phase change material of the variable resistive element RC may include diverse kinds of materials. For example, the phase change material may be a combination of two elements, e.g., GaSb, InSb, InSe, $Sb_2Te_3$, GeTe, and the like, a combination of three elements, e.g., GeSbTe, GaSeTe, InSbTe, $SnSb_2Te_4$, InSbGe, and the like, a combination of four elements, e.g., AgInSbTe, (GeSn)SbTe, GeSb(SeTe), $Te_{81}Ge_{15}Sb_2S_2$, and the like, and so forth.

Figure 3:
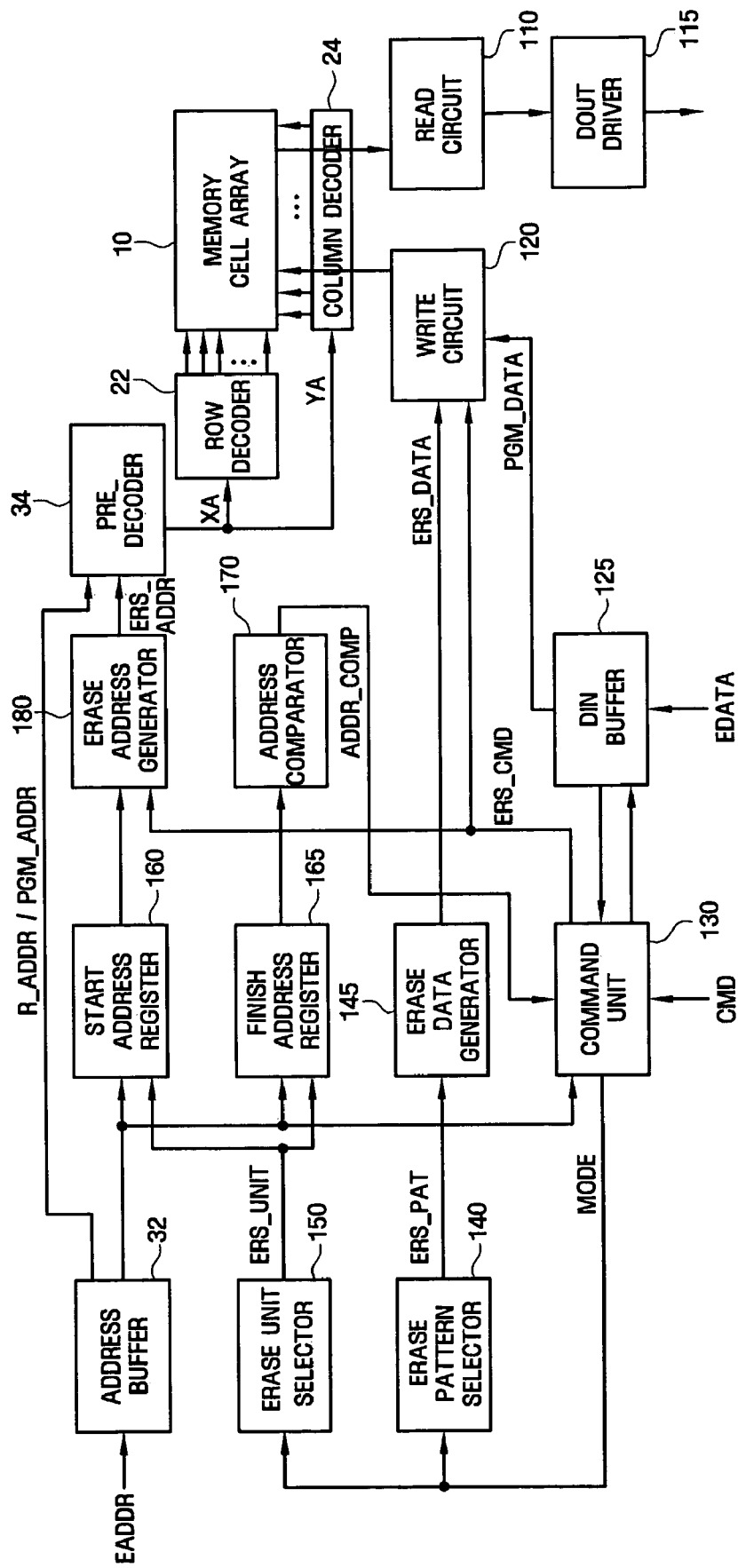
FIG. 3 illustrates a block diagram explaining a memory device according to a first embodiment of the present inventive concept.

FIG. 3 illustrates a block diagram explaining a memory device according to a first embodiment of the present inventive concept. Referring to FIG. 3, a memory device according to the first embodiment of the present inventive concept may include the memory cell array 10, a row decoder 22, a column decoder 24, a pre-decoder 34, an address buffer 32, a start address register 160, a finish address register 165, an erase address generation unit 180, an address comparison unit 170, an erase unit selection unit 150, an erase data pattern selection unit 140, an erase data generation unit 145, a control unit 130, a write circuit 120, a read circuit 110, an input buffer 125, an output driver 115, and the like.

The memory cell array 10 may include a plurality of memory cells MC. As described above, the memory cell MC may include the variable resistive element RC which is changed to a crystalline state or an amorphous state in accordance with tunneling current and which has different resistance values in accordance with its phase states, and the access element AC controlling the tunneling current that flows through the variable resistive element RC.

The row decoder 22 may receive and decode a row address XA from the pre-decoder 34, and designates rows of the memory cells MC to be read or written. The column decoder 24 may receive and decode a column address YA from the pre-decoder 34, and designates columns of the memory cells to be read or written. The address buffer 32 may receive an external address EADDR, and outputs a read address R_ADDR or a program address PGM_ADDR to the pre-decoder 34. Also, the address buffer 32 may receive the external address EADDR, and outputs a start address and a finish address included in the external address EADDR to the start address register 160 and the finish address register 165, respectively.

The read circuit 110 is a circuit for reading data stored in the selected memory cell MC in the memory cell array 10. The read data may be output to the outside through the output driver 115. The read circuit 110, for example, may provide a read bias to the selected memory cell MC and may read data stored in the selected memory cell MC by sensing the level change of a sensing node coupled to the selected memory cell MC.

The write circuit 120 is a circuit for writing data in the selected memory cell MC in the memory cell array 10. On the other hand, as the memory device using the resistance material has been discussed as a storage medium that can substitute for the flash memory device in several application fields (e.g. a computer system, a portable media system, and the like), the existing user may use the memory device using the resistance material as the flash memory device without correcting software. Accordingly, the memory device according to the first embodiment of the present inventive concept may perform not only a program operation in accordance with a program command output from the outside, but also an erase operation in accordance with an erase command input from the outside. Accordingly, the write circuit 120 may write program data PGM_DATA provided through the input buffer 125 during the program operation in the selected memory cell. Further, the write circuit 120 may write erase data ERS_DATA provided from the erase data generation unit 145 during an erase operation in a plurality of memory cells corresponding to an erase unit ERS_UNIT selected by the erase unit selection unit 150.

Here, the erase unit ERS_UNIT may be a number of memory cells in which the erase data is simultaneously written during the erase operation of the memory device or the amount of data stored in the memory cell. For example, if the erase unit is one memory block unit, erase data may be simultaneously written in the plurality of memory cells included in the respective memory blocks to perform the erase operation. If the erase unit is one word line unit, erase data may be simultaneously written in the plurality of memory cells coupled to the respective word lines to perform the erase operation. If the erase unit is one word unit, erase data may be simultaneously written in the plurality of memory cells in which data of one word unit is stored to perform the erase operation, and so forth.

The control unit 130 controls respective constituent elements (e.g. the write circuit 120, the erase unit selection unit 150, the erase data pattern selection unit 140, and the like) of the memory device in response to the command CMD. In particular, the control unit 130 according to the first embodiment of the inventive concept may control the erase operation so that the erase unit or the erase data pattern differs for each erase mode by providing a mode signal MODE to the erase unit selection unit 150 and the erase data pattern selection unit 140. Here, the erase unit or the erase data pattern may be programmed using, for example, an MRS (Mode Register Set), a fuse, or the like.

Hereinafter, the operation of the control unit 130 that controls the memory device so that the erase unit differs for each erase mode will be described in detail.

Figure 4:
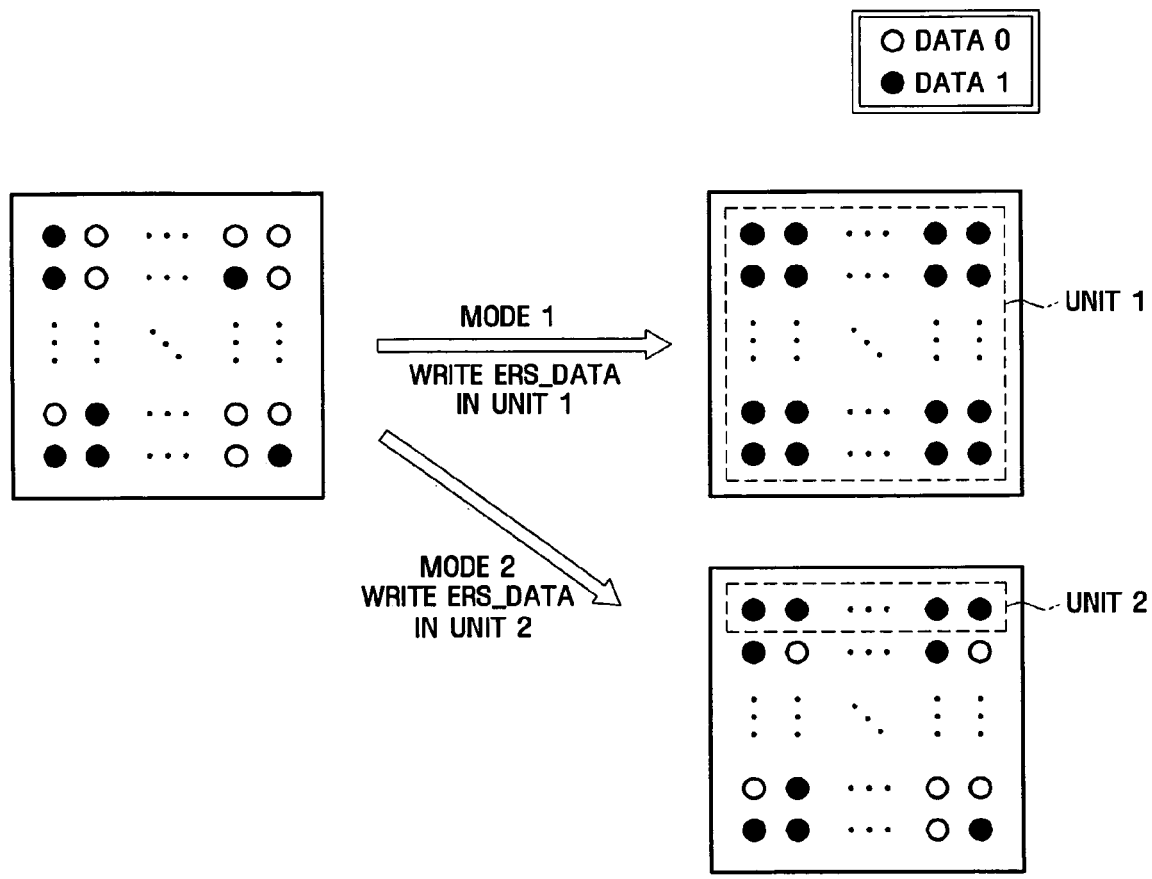
FIG. 4 illustrates a conceptual view explaining variation of an erase unit in each erase mode in a memory device according to the first embodiment of the present inventive concept.

FIG. 4 illustrates a conceptual view explaining variation of an erase unit in each erase mode in a memory device according to the first embodiment of the present inventive concept. In FIG. 4, for convenience in explanation, "0" data and "1" data are illustrated as, but are not limited to, program data PGM_DATA and erase data ERS_DATA, respectively.

Referring to FIGS. 3 and 4, in a first erase mode, the control unit 130 may simultaneously write erase data in the plurality of memory cells corresponding to a first erase unit and, in a second erase mode, the control unit 130 may simultaneously write erase data in the plurality of memory cells corresponding to a second erase unit, wherein the first and second erase units have different sizes. Specifically, if the control unit 130 provides a mode signal MODE, the erase unit selection unit 150, in response to the mode signal, selects the erase unit, and outputs the erase unit signal ERS_UNIT to the start address register 160 and the finish address register 165. Also, the erase address generation unit 180 generates an erase address ERS_ADDR corresponding to the erase unit to perform the erase operation.

Accordingly, in the first erase mode, the control unit 130 may provide a mode signal MODE1 to the erase selection unit 150. In response, the memory device may perform the erase operation by simultaneously writing the erase data, e.g. "1" data, in a plurality of memory cells corresponding to a first erase unit UNIT1, e.g., one memory block unit. In the second erase mode, the control unit 130 may provide a mode signal MODE2 to the erase selection unit 150. In response, the memory device may perform the erase operation by simultaneously writing the erase data, e.g. "1" data, in a plurality of memory cells corresponding to a second erase unit UNIT2, e.g. one word line unit.

That is, the memory device according to the first embodiment of the present inventive concept may perform the erase operation not only in one memory block unit as the erase unit, but in an erase unit that is smaller than the one memory block unit, e.g., one word line unit. Accordingly, the memory device according to the first embodiment of the present inventive concept may variably control the erase unit in accordance with a user's request. Thus, the memory cell array 10 may be used more efficiently.

In FIG. 4, one memory block unit and one word line unit are illustrated as first and second erase units UNIT1 and UNIT2, respectively. However, the first and second erase units UNIT1 and UNIT2 are not limited thereto. For example, an erase unit may be one memory block unit, one word line unit, one word unit, and so forth. Erase units may differ for each erase mode.

Hereinafter, the operation of the control unit 130 that controls the memory device so that the erase pattern differs for each erase mode will be described in detail. FIGS. 5A to 5D are conceptual views explaining variation of an erase data pattern in each erase mode in a memory device according to the first embodiment of the present inventive concept.

Referring to FIGS. 3 to 5D, the control unit 130 may control the erase operation so that the erase data written in a plurality of memory cells included in the respective memory blocks after the erase operation has different erase data patterns for each erase mode of the erase operation. Specifically, when the control unit 130 provides a mode signal MODE, the erase data pattern selection unit 140, in response to the mode signal MODE, selects the erase data pattern and outputs the erase data pattern signal ERS_PAT. Also, the erase data generation unit 145 may output the erase data ERS_DATA to the write circuit 120 in response to the erase data pattern signal ERS_PAT. The write circuit 120 may simultaneously write the erase data ERS_DATA in the plurality of memory cells corresponding to the erase unit. Accordingly, in the memory device according to the first embodiment of the present inventive concept, the erase data pattern may differ for each erase mode.

Figure 5A:
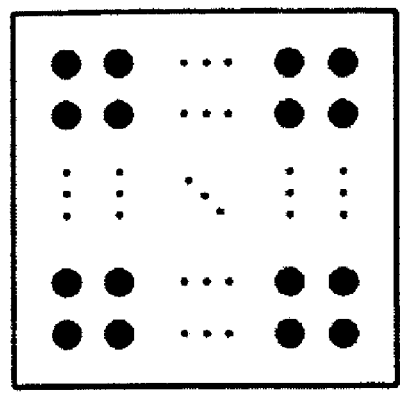
FIGS. 5A to 5D illustrate conceptual views explaining variation of an erase data pattern in each erase mode in a memory device according to the first embodiment of the present inventive concept.
Figure 5B:
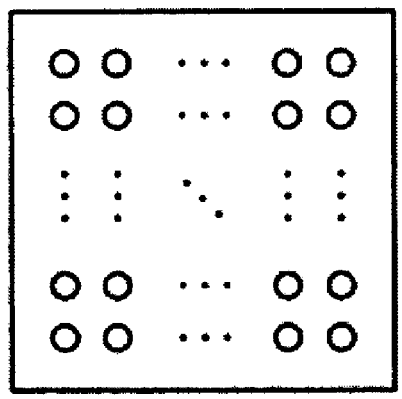
Figure 5C:
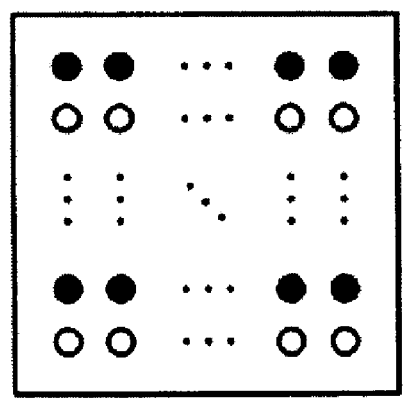
Figure 5D:
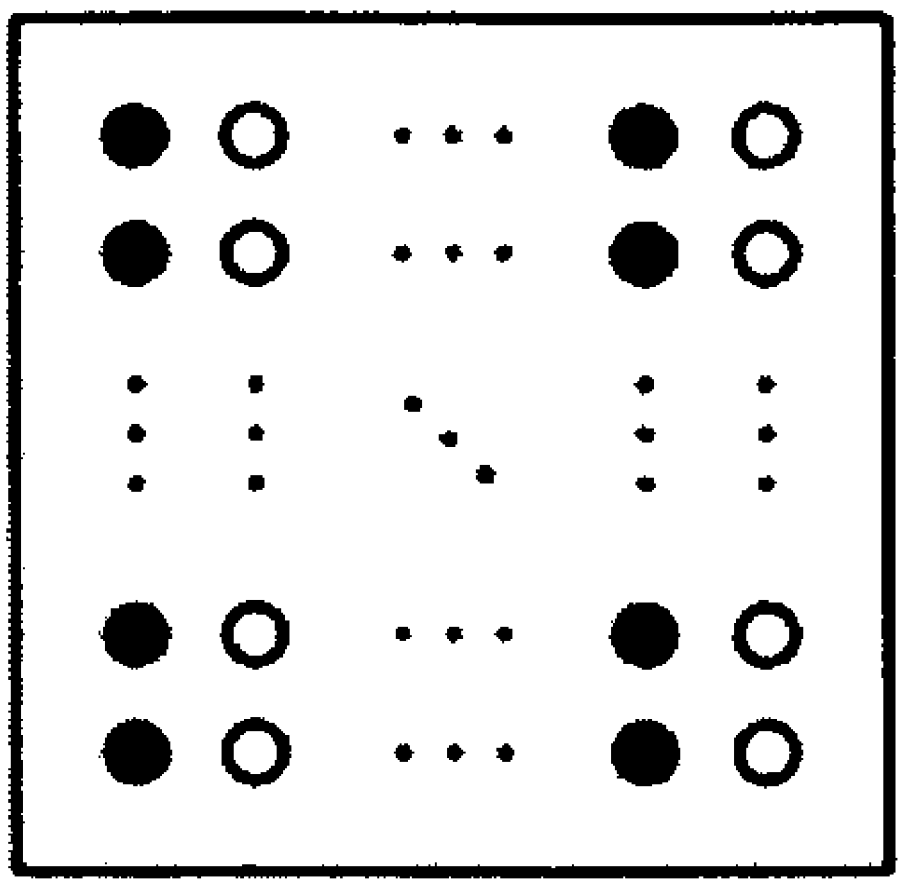

For example, after the erase operation, the erase data pattern corresponding to the respective memory blocks, as shown in FIGS. 5A to 5D, may include first to fourth erase data patterns that are different from one another. In the first erase data pattern, illustrated in FIG. 5A, the erase data written in all the memory cells MC may have a first level (e.g. "1" data). In the second erase data pattern, illustrated in FIG. 5B, the erase data written in the plurality of memory cells may have a second level (e.g. "0" data) that is different from the first level. In the third erase data pattern, illustrated in FIG. 5C, the erase data written in the plurality of memory cells coupled to the first word line among the plurality of word lines may have the first level, whereas the erase data written in the plurality of memory cells coupled to the second word line among the plurality of word lines may have the second level. For example, according to the third erase data pattern as shown in FIG. 5C, the erase unit may become the word line unit during the erase operation. Thus, "0" data and "1" data may be repeated in the word line unit after the erase operation. In the fourth erase data pattern, illustrated in FIG. 5D, the erase data written in the plurality of memory cells coupled to the first bit line among the plurality of bit lines may have the first level, whereas the erase data written in the plurality of memory cells coupled to the second bit line among the plurality of bit lines may have the second level. For example, according to the fourth erase data pattern, as shown in FIG. 5D, the erase unit may become the word unit during the erase operation, and thus "0" data and "1" data may be repeated in the bit line unit after the erase operation.

That is, in the memory device according to the first embodiment of the inventive concept, the erase data pattern corresponding to the respective memory blocks may differ for each erase mode. Accordingly, a user (or a system) may perform the erase operation in diverse erase data patterns. Thus, efficiency may be improved during the erase operation of the memory device. In addition, since diverse erase data patterns can be used when the fabricated memory device is tested, defects of the memory device can be tested more efficiently.

In summary, the memory device according to the first embodiment of the present inventive concept may have diverse erase modes during the erase operation in accordance with the selected erase unit and erase data pattern as shown in Table 1 below.

TABLE 1

| Erase Mode | Erase Unit | Erase Data Pattern |
|---|---|---|
| A | One memory block unit | First erase data pattern |
| B | | Second erase data pattern |
| C | | Third erase data pattern |
| D | | Fourth erase data pattern |
| E | One word line unit | First erase data pattern |
| F | | Second erase data pattern |
| G | | Third erase data pattern |
| H | | Fourth erase data pattern |
| I | One word unit | First erase data pattern |
| J | | Second erase data pattern |
| K | | Third erase data pattern |
| L | | Fourth erase data pattern |

Also, when writing erase data to a plurality of memory cells corresponding to n erase units, the control unit 130 according to the first embodiment of the present inventive concept may control the erase operation using only the start address stored in the start address register 160 and the finish address stored in the finish address register 165. The start address may be the first address among n addresses that correspond to n erase units arranged in ascending order. The finish address may be the last address among n addresses that correspond to n erase units arranged in ascending order.

Figure 6A:
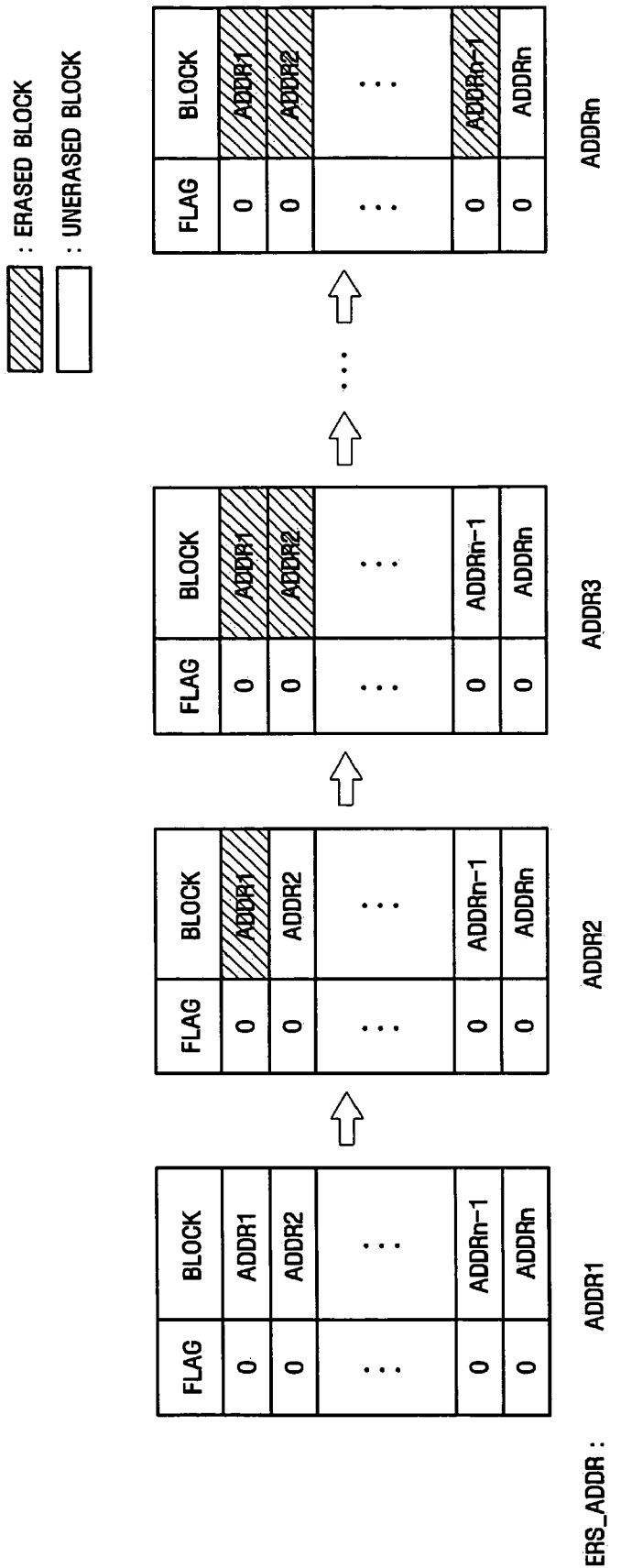
FIGS. 6A and 6B illustrate conceptual views explaining erase address generation in a memory device according to the first embodiment of the present inventive concept.
Figure 6B:
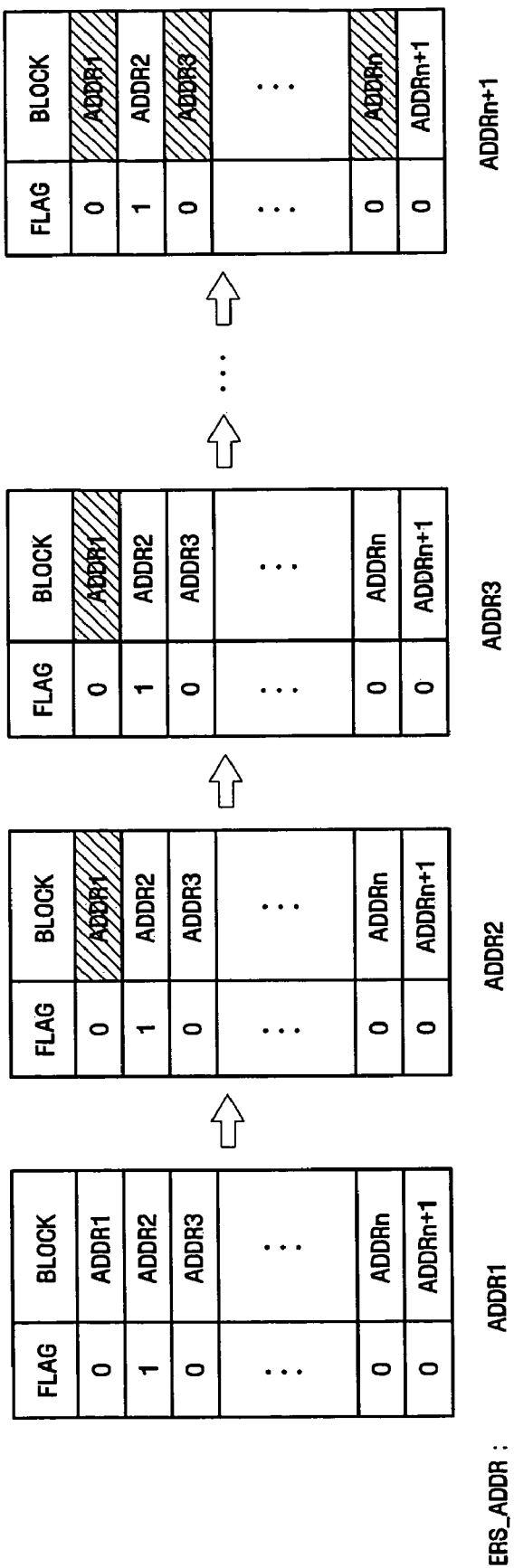

Specifically, this erase control operation will be described with reference to FIGS. 3, 6A, and 6B. FIGS. 6A and 6B are conceptual view explaining erase address generation in a memory device according to the first embodiment of the present inventive concept. In FIGS. 6A and 6B, for convenience in explanation, it is exemplified that the erase unit is a memory block unit, but erase unit are not limited thereto. For example, the erase unit in another embodiment of the present inventive concept may be a word line unit or a word unit.

The start address register 160 receives the erase unit signal ERS_UNIT from the erase unit selection unit 150 and the address from the address buffer 32, and stores the start address among n addresses corresponding to n erase units. The finish address register 165 receives the erase unit signal ERS_UNIT from the erase unit selection unit 150 and the address from the address buffer 32, and stores the finish address among n addresses corresponding to n erase units. Here, if the erase unit selection unit 150 selects a memory block unit as the erase unit, the start address ADDR1 and the finish address ADDRn among n addresses ADDR1 to ADDRn corresponding to n erase units may be stored in the start address register 160 and the finish address register 165, respectively.

The erase address generation unit 180 generates the erase address ERS_ADDR using the start address. Specifically, as shown in FIG. 6A, the erase address generation unit 180 may generate the erase address ERS_ADDR by sequentially increasing the start address. Accordingly, the memory device can perform the erase operation with respect to the memory block (e.g. ADDR1 to ADDRn) which corresponds to the erase address ERS_ADDR and in which a protection flag is set to "invalid". The protection flag may indicate whether the corresponding memory block should be protected during the program operation and the erase operation. If the protection flag is set to "valid", the program data or the erase data is not written in the corresponding memory block, whereas if the protection flag is set to "invalid", the program data or the erase data may be written in the corresponding memory block.

Alternatively, as shown in FIG. 6B, the erase address generation unit 180 may generate the erase address ERS_ADDR by sequentially increasing the start address even in the case where n addresses ADDR1, ADDR3 to ADDRn+1 correspond to n erase units are not continuous. However, the memory device corresponds to the erase address ERS_ADDR, but the erase operation may not be performed in a memory block in which the protection flag is set to "valid" (e.g. the memory block corresponding to ADDR2). Accordingly, even if the erase address ERS_ADDR is generated by sequentially increasing the start address, the erase operation is not performed with respect to the memory block in which the user does not want to erase data (e.g. the memory block corresponding to ADDR2), and thus the reliability of the erase operation may be secured.

The address comparison unit 170 may generate an address comparison signal ADDR_COMP using the erase address ERS_ADDR and the finish address. Specifically, the address comparison unit 170 may provide the address comparison signal ADDR_COMP to the control unit 130 when the erase address ERS_ADDR and the finish address are equal to each other.

Then, the control unit 130 may end the erase operation in response to the address comparison signal ADDR_COMP. For example, the control unit 130, in response to the address comparison signal ADDR_COMP, i.e. if the erase address ERS_ADDR and the finish address are equal, may provide to the write circuit 120 an erase command CMD for ending the erase operation after performing the erase operation in the erase unit corresponding to the erase address ERS_ADDR (specifically, the erase unit corresponding to the finish address).

That is, in the case of writing the erase data in the plurality of memory cells corresponding to n erase units, the memory device according to the first embodiment of the present inventive concept stores only the start address and the finish address among n addresses in the start address register 160 and the finish address register 165, and performs the erase operation using the stored start address and finish address. Accordingly, in comparison to the case where the erase operation is performed through storing of n addresses corresponding to n erase units, the number of address registers is reduced and the time for loading the addresses from the respective address registers is reduced, resulting in that the whole erase operation time can be reduced.

Figure 7A:
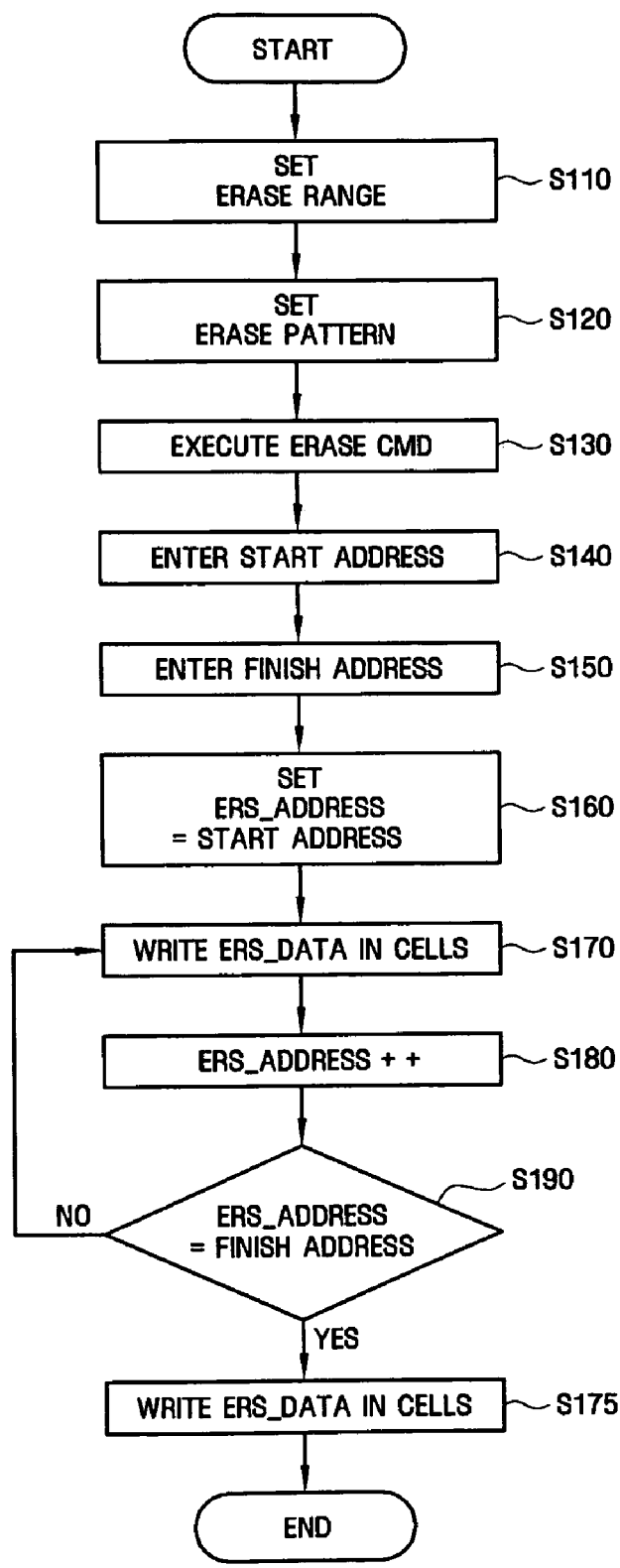
FIGS. 7A and 7B illustrate flowcharts explaining an erase operation of a memory device according to the first embodiment of the present inventive concept.
Figure 7B:
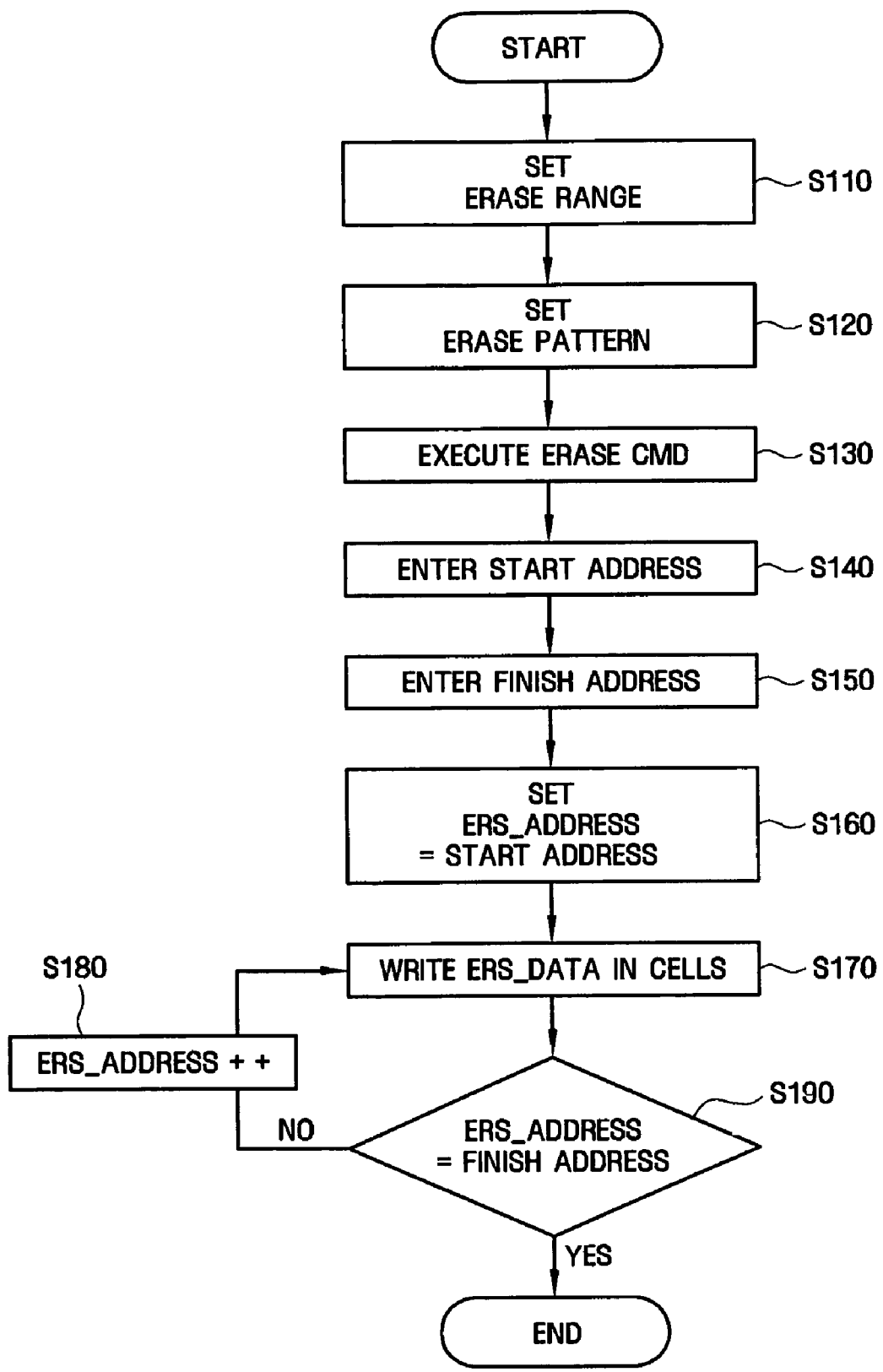
Figure 8:
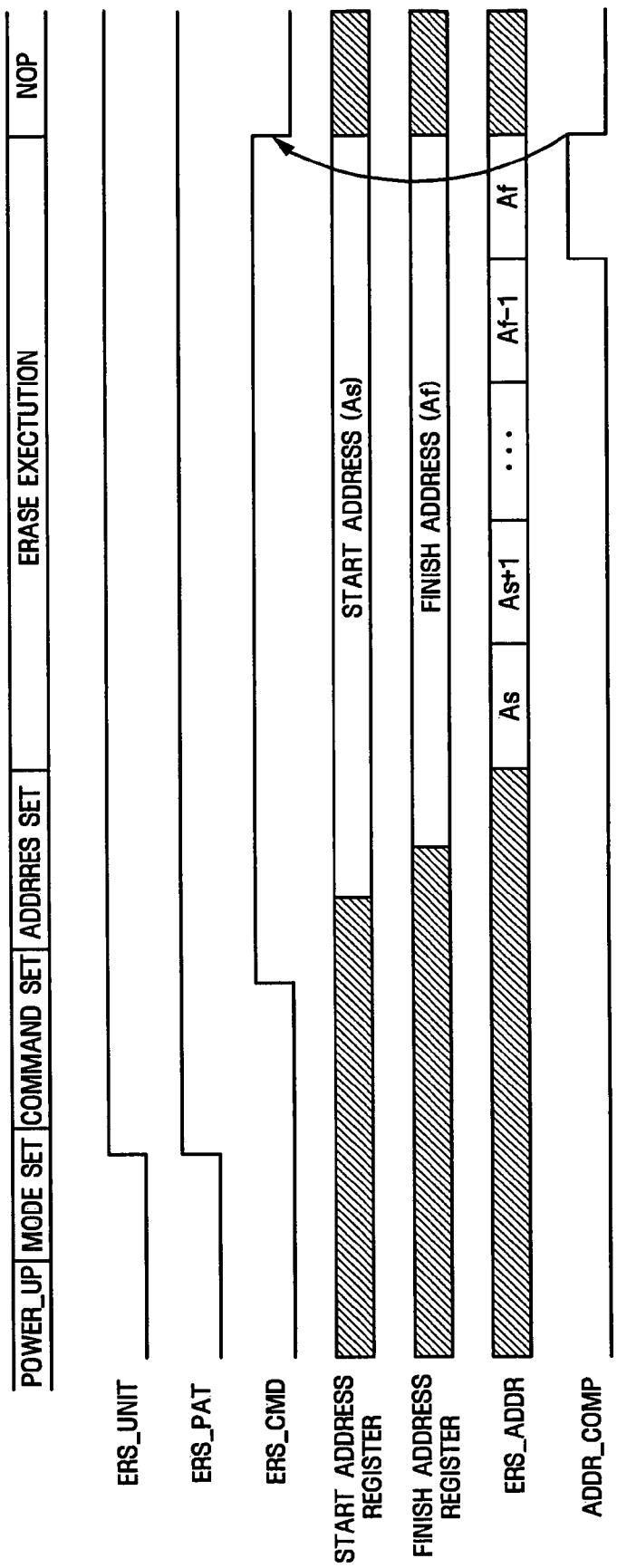
FIG. 8 illustrates a timing diagram explaining an erase operation of a memory device according to the first embodiment of the present inventive concept.

FIGS. 7A and 7B illustrate flowcharts explaining an erase operation of a memory device according to the first embodiment of the present inventive concept. FIG. 8 illustrates a timing diagram explaining an erase operation of a memory device according to the first embodiment of the present inventive concept. With reference to FIGS. 3, 7A, 7B, and 8, the above-described erase operation is summarized as follows.

If an external mode selection command is input to the memory device, the memory device, in response to the input mode selection command, selects the erase unit (S110), and selects the erase data pattern (S120). In FIG. 7A, operations S110 and S120 are illustrated in that order, but the order of selection is not limited thereto. That is, operations S110 and S120 may be simultaneously performed or may be performed in the order of operations S120 and S110.

Then, an external erase command is input to the memory device (S130), the start address is stored in the start address register 106 (S140), and the finish address is stored in the finish address register 165 (S150).

The erase address generation unit 180 may generate the erase address ERS_ADDR using the start address stored in the start address register 160 (S160). Erase data is written to the erase unit corresponding to the erase address ERS_ADDR (S170). Specifically, in operation (S170), the erase data generation unit 145 may output the erase data ERS_DATA corresponding to the erase data pattern and the write circuit 120, in response to this, writes the erase data ERS_DATA in the plurality of memory cells corresponding to the erase unit.

Then, the erase address generation unit 180 may sequentially increase the erase address ERS_ADDR (S180) and the address comparison unit 170 may compare the erase address ERS_ADDR with the finish address (S190). If the erase address ERS_ADDR and the finish address are equal, the erase operation is performed in the erase unit corresponding to the finish address (S175). After the erase operation is performed in the finish erase unit, the erase operation of the memory device is ended. In contrast, if the erase address ERS_ADDR and the finish address are not equal to each other, the operation returns to continue writing erase data (S170).

While the flowchart in FIG. 7A illustrates that the erase address generation unit 180 sequentially increases the erase address ERS_ADDR (S180) before comparing the erase address ERS_ADDR with the finish address (S190), the erase operation is not limited thereto. For example, as shown in FIG. 7B, after comparing the erase address ERS_ADDR with the finish address, the erase address generation unit 180 may sequentially increase the erase address (S180) in accordance with the result of comparison. In this case, if the erase address ERS_ADDR and the finish address are equal, the erase operation may be immediately ended.

As illustrated in the timing diagrams of FIG. 8, once the erase address ERS_ADDR equals a finish address Af, the erase execution is halted.

Figure 9:
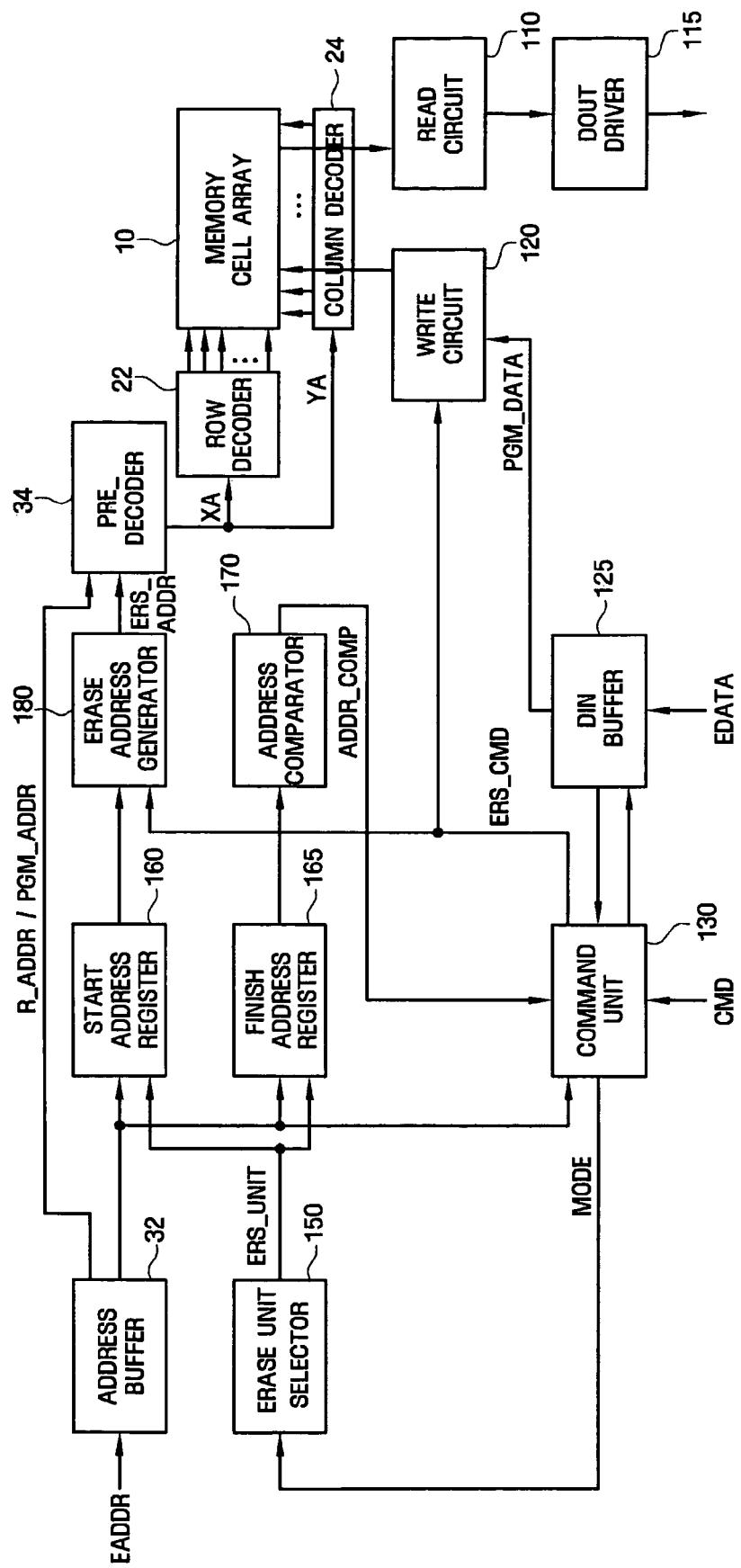
FIG. 9 illustrates a block diagram explaining a memory device according to a second embodiment of the present inventive concept.

FIG. 9 illustrates a block diagram of a memory device according to a second embodiment of the present inventive concept.

Referring to FIGS. 3 and 9, the memory device according to the second embodiment of the present inventive concept is substantially the same as the memory device according to the first embodiment of the present inventive concept, except that the erase data pattern is not varied in accordance with the erase mode.

Specifically, in the memory device according to the second embodiment of the present inventive concept, the control unit 130 may control the erase operation so that the erase unit differs for each erase mode by providing a mode signal MODE to the erase unit selection unit 150. Also, in the case of writing the erase data in the plurality of memory cells corresponding to n erase units, the control unit 130 can control the erase operation using only the start address stored in the start address register 160 and the finish address stored in the finish address register 165.

However, unlike the memory device according to the first embodiment of the present inventive concept, the memory device according to the second embodiment of the present inventive concept does not include the erase data pattern selection unit and the erase data generation unit, and thus the erase data provided during the erase operation may be the same at any time. For example, even if the erase unit is varied in accordance with the erase mode, e.g., the memory block unit, the word line unit, or the word unit, the erase data written in the plurality of memory cells after the erase operation is ended may have only the first level (e.g. "1" data) regardless of the erase mode.

Figure 10:
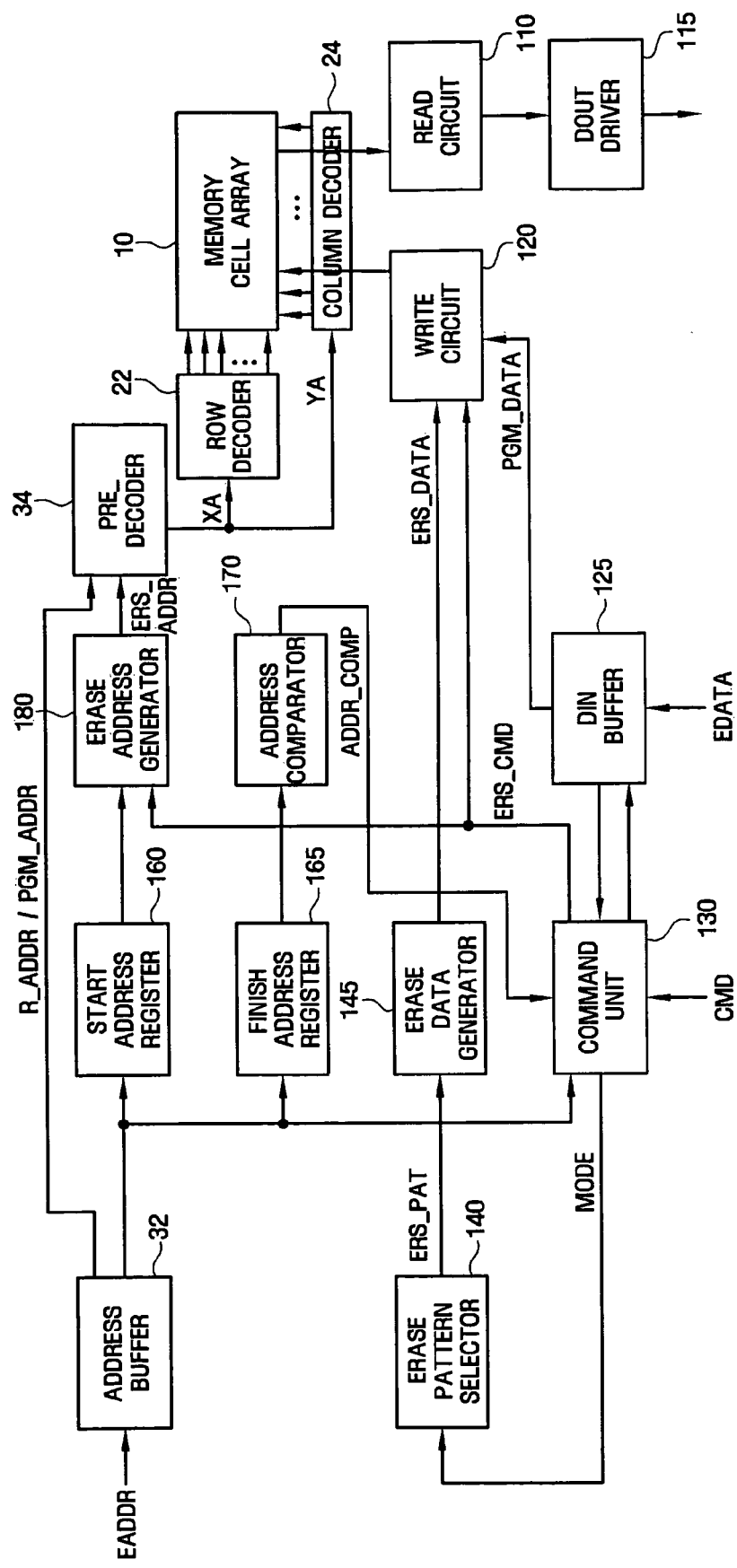
FIG. 10 illustrates a block diagram explaining a memory device according to a third embodiment of the present inventive concept.

FIG. 10 illustrates a block diagram of a memory device according to a third embodiment of the present inventive concept.

Referring to FIGS. 3 and 10, the memory device according to the third embodiment of the present inventive concept is substantially the same as the memory device according to the first embodiment of the present inventive concept except that the erase unit is not varied in accordance with the erase mode.

Specifically, in the memory device according to the third embodiment of the present inventive concept, the control unit 130 may control the erase operation so that the erase data pattern differs for each erase mode by providing a mode signal MODE to the erase data pattern selection mode 140. Also, in the case of writing the erase data in the plurality of memory cells corresponding to n erase units, the control unit 130 can control the erase operation using only the start address stored in the start address register 160 and the finish address stored in the finish address register 165.

However, unlike the memory device according to the first embodiment of the present inventive concept, the memory device according to the third embodiment of the present inventive concept does not include the erase unit selection unit. Thus, the erase unit is constant, e.g., one of the memory block unit, the word line unit, and the word unit. For example, if the erase unit is preset to the memory block unit, the erase data pattern after the erase operation is ended is determined so that the erase data written in the plurality of memory cells according to the erase mode has the first level (e.g. "1" data) or the second level (e.g. "0" data) in accordance with the erase mode.

Figure 11:
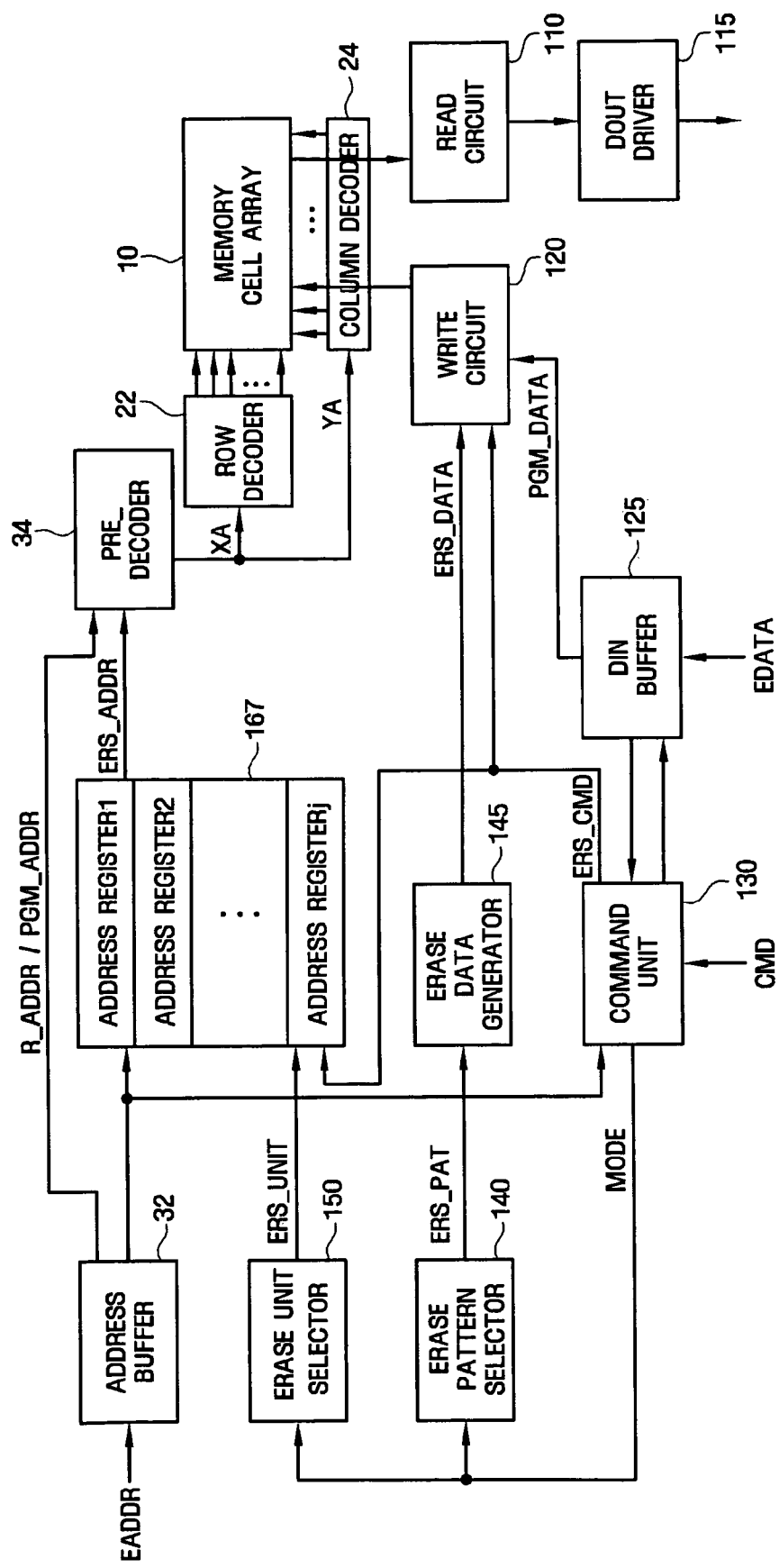
FIG. 11 illustrates a block diagram explaining a memory device according to a fourth embodiment of the present inventive concept.

FIG. 11 illustrates a block diagram explaining a memory device according to a fourth embodiment of the present inventive concept. Referring to FIGS. 3 and 11, the memory device according to the fourth embodiment of the present inventive concept is substantially the same as the memory device according to the first embodiment of the present inventive concept except that in the case of writing the erase data in the plurality of memory cells corresponding to n erase units, the erase operation is performed using n addresses corresponding to n erase units.

Specifically, in the memory device according to the fourth embodiment of the present inventive concept, the control unit 130 may control the erase operation so that the erase unit and the erase data pattern differ for each erase mode by providing a mode signal MODE to the erase unit selection unit 150 and the erase data pattern selection unit 140.

However, unlike the memory device according to the first embodiment of the present inventive concept, the memory device according to the fourth embodiment of the present inventive concept includes an address register unit 167 composed of at least j (where, j≧n, and j is a natural number) address registers, and n addresses corresponding to n erase units are stored in the address register unit 167. Accordingly, the memory device according to the fourth embodiment of the present inventive concept may perform the erase operation in the corresponding erase units using the addresses stored in the address register unit 167 as the erase address ERS_ADDR.

Additionally, although not illustrated separately, a memory device according to a fifth embodiment of the present inventive concept may be substantially the same as the memory device according to the second embodiment of the present inventive concept except that the erase operation is performed using n addresses corresponding to n erase units. That is, the memory device according to the fifth embodiment of the present inventive concept may include the address register unit of FIG. 11, instead of the start address register, the finish address register, the erase address generation unit, and the address comparison unit included in the memory device of FIG. 9.

Also, although not illustrated separately, a memory device according to a sixth embodiment of the present inventive concept may be substantially the same as the memory device according to the third embodiment of the present inventive concept except that the erase operation is performed using n addresses corresponding to n erase units. That is, the memory device according to the sixth embodiment of the present inventive concept may include the address register unit of FIG. 11, instead of the start address register, the finish address register, the erase address generation unit, and the address comparison unit included in the memory device of FIG. 10.

Also, although not illustrated separately, a memory device according to a seventh embodiment of the present inventive concept may be substantially the same as the memory device according to the second embodiment of the present inventive concept except that the same erase unit is used regardless of the erase mode. That is, the memory device according to the seventh embodiment of the present inventive concept may be substantially the same as the memory device of FIG. 9 except for the point that the erase unit selection unit is not included therein.

Figure 12:
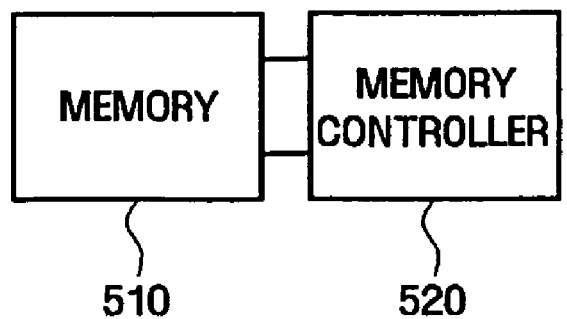
FIGS. 12 to 14 illustrate views explaining use examples of a nonvolatile memory device fabricated according to the embodiments of the present inventive concept.
Figure 13:
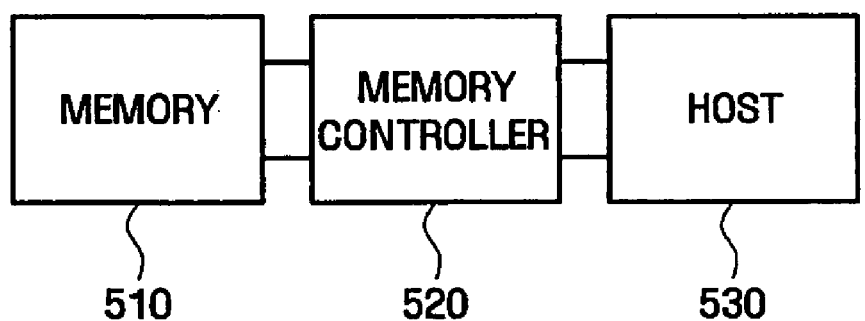
Figure 14:
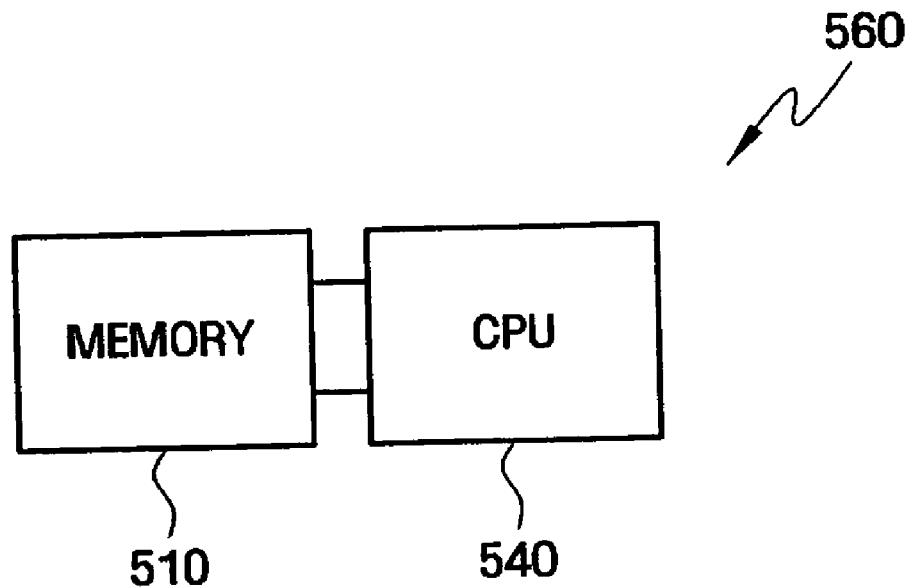

FIGS. 12 to 14 illustrate views explaining use examples of a nonvolatile memory device according to the embodiments of the present inventive concept.

Referring to FIG. 12, a system according to an embodiment of the present inventive concept may include a memory 510, and a memory control unit 520 connected to the memory 510. The memory 510 may be a nonvolatile memory device according to the embodiments of the present inventive concept as described above. The memory control unit 520 may provide an input signal corresponding to the control of the operation of the memory 510, e.g., a command signal for controlling a read operation and a write operation, and an address signal, to the memory 510.

The system including the memory 510 and the memory control unit 520 as described above may be embodied into a card, e.g., a memory card. Specifically, the system according to an embodiment of the present inventive concept may be embodied to a card that satisfies a specified industry standard used in an electronic device, e.g., a portable phone, a two-way communication system, a one-way pager, a two-way pager, a personal communication system, a portable computer, a personal data assistance (PDA), an audio and/or video player, a digital and/or video camera, a navigation system, a global positioning system, and so forth. However, the present system is not limited thereto, and the system according to an embodiment of the present inventive concept may be embodied in diverse forms, e.g., a memory stick and so on.

Referring to FIG. 13, the system according to another embodiment of the present inventive concept may include the memory 510, a memory control unit 520, and a host system 530. The host system 530 may be connected to the memory control unit 520, e.g., through a bus. The host system 530 may make the memory control unit 520 control the operation of the memory 510 by providing a control signal to the memory control unit 520. The host system 530 may be, e.g., a processing system for use in a portable phone, a two-way communication system, a one-way pager, a two-way pager, a personal communication system, a portable computer, personal data assistance (PDA), an audio and/or video player, a digital and/or video camera, a navigation system, a global positioning system, and so forth.

Although FIG. 13 illustrates that the memory control unit 520 is interposed between the memory 510 and the host system 530, the position of the memory control unit is not limited thereto. In the system according to still another embodiment of the present inventive concept, the memory control unit 520 may be selectively omitted.

Referring to FIG. 14, the system according to still another embodiment of the present inventive concept may be a computer system 560 including a CPU (Central Processing Unit) 540 and the memory 510. In the computer system 560, the memory 510 may be connected to the CPU 540 directly or through typical computer bus architecture. The memory 510 may store an OS (Operating System), an instruction set, a BIOS (Basic Input/Output Startup) instruction set, an ACPI (Advanced Configuration and Power Interface) instruction set, and the like, or may be used as a large-capacity storage device.

In FIG. 14, all constituent elements included in the computer system 560 are not illustrated for convenience in explanation, and the present inventive concept is not limited thereto. Although the memory control unit 520 interposed between the memory 510 and the CPU 540 is omitted in FIG. 14, the memory control unit 520 may be interposed between the memory 510 and the CPU 540 in still another embodiment of the present inventive concept.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory device, comprising:
a memory cell array including a plurality of memory blocks, each memory block including a plurality of memory cells;
a plurality of word lines coupled to rows of the plurality of memory cells;
a plurality of bit lines coupled to columns of the plurality of memory cells; and
a control unit configured to control an erase operation in accordance with an erase mode such that erase data is simultaneously written to memory cells in accordance with an erase unit, wherein a first erase mode includes a first erase unit and a first erase data pattern, a second erase mode includes a second erase unit and a second erase pattern, and at least one of the first and second erase units and the first and second erase data patterns are different.

2. The memory device as claimed in claim 1, wherein the first and second erase units are different.

3. The memory device as claimed in claim 2, wherein the first and second erase data patterns in respective memory blocks are different.

4. The memory device as claimed in claim 3, wherein the first erase data pattern writes erase data having a first level and the second erase data pattern writes erase data having a second level, different from the first level.

5. The memory device as claimed in claim 4, wherein the erase data pattern further includes:
a third erase data pattern in which a erase data written in the plurality of memory cells coupled to a first word line among the plurality of word lines have the first level, and erase data written in the plurality of memory cells coupled to a second word line among the plurality of word lines have the second level; and
a fourth erase data pattern in which the erase data written in the plurality of memory cells coupled to a first bit line among the plurality of bit lines have the first level, and erase data written in the plurality of memory cells coupled to a second bit line among the plurality of bit lines have the second level.

6. The memory device as claimed in claim 2, wherein, when an amount of data stored in the plurality of memory cells included in a respective memory block is a memory block unit and an amount of data stored in the plurality of memory cells coupled to a respective word line is a word line unit, the first and second erase units are selected among the memory block unit, the word line unit, and a word unit.

7. The memory device as claimed in claim 1, wherein, when writing erase data in the plurality of memory cells corresponding to n (where, n is a natural number) erase units, the control unit is configured to control the erase operation using only a start address and a finish address among n addresses corresponding to the respective erase units.

8. The memory device as claimed in claim 7, further comprising:
an erase address generation unit configured to generate an erase address using the start address; and
an address comparison unit configured to compare the erase address with the finish address, wherein the control unit is configured to end the erase operation when the erase address equals the finish address.

9. The memory device as claimed in claim 8, wherein the erase address is sequentially increased after erase data is written in the plurality of memory cells corresponding to the respective erase units.

10. The memory device as claimed in claim 1, wherein the first and second erase data patterns in respective memory blocks are different.

11. The memory device as claimed in claim 10, wherein the first erase data pattern writes erase data having a first level and the second erase data pattern writes erase data having a second level, different from the first level.

12. The memory device as claimed in claim 11, wherein the erase data pattern further includes:
a third erase data pattern in which erase data written in the plurality of memory cells coupled to a first word line among the plurality of word lines have the first level and erase data written in the plurality of memory cells coupled to a second word line among the plurality of word lines have the second level; and
a fourth erase data pattern in which the erase data written in the plurality of memory cells coupled to a first bit line among the plurality of bit lines have the first level and erase data written in the plurality of memory cells coupled to a second bit line among the plurality of bit lines have the second level.

13. A memory device, comprising:
a memory cell array including a plurality of memory blocks, each memory block including a plurality of memory cells; and
a control unit configured to control an erase operation so that erase data is simultaneously written in the plurality of memory cells corresponding to an erase unit;
wherein when the erase data is written in the plurality of memory cells corresponding to n (where, n is a natural number) erase units during an erase operation, the control unit is configured to control the erase operation using only a start address and a finish address among a plurality of addresses corresponding to the respective erase units.

* * * * *